United States Patent
Gong et al.

(10) Patent No.: US 7,227,389 B2
(45) Date of Patent: Jun. 5, 2007

(54) CIRCUIT AND METHOD FOR COMPENSATING FOR OFFSET VOLTAGE

(75) Inventors: Jung Chul Gong, Seoul (KR); Kyoung Soo Kwon, Kyunggi-Do (KR); Hyeon Seok Hwang, Seoul (KR); Sang Suk Kim, Kyunggi-Do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 35 days.

(21) Appl. No.: 11/119,437

(22) Filed: Apr. 29, 2005

(65) Prior Publication Data

US 2006/0186953 A1    Aug. 24, 2006

(30) Foreign Application Priority Data

Feb. 23, 2005    (KR) .................... 10-2005-0015020

(51) Int. Cl.
*H03K 5/22* (2006.01)
(52) U.S. Cl. .................... 327/83; 327/307; 327/513
(58) Field of Classification Search ............... 327/307, 327/513, 83
See application file for complete search history.

(56) References Cited

U.S. PATENT DOCUMENTS

| | | | | |
|---|---|---|---|---|
| 4,943,737 A * | 7/1990 | Guo et al. | ................... | 327/542 |
| 5,774,013 A * | 6/1998 | Groe | .......................... | 327/543 |
| 6,118,327 A * | 9/2000 | Watarai | ...................... | 327/513 |
| 6,847,254 B2 * | 1/2005 | Pai | .............................. | 327/572 |
| 2001/0028278 A1 * | 10/2001 | Ooishi | ......................... | 331/57 |

OTHER PUBLICATIONS

Patent Abstract of Japan for 11-068476 published on Mar. 9, 1999.

* cited by examiner

*Primary Examiner*—Long Nguyen
*Assistant Examiner*—Ryan C. Jager
(74) *Attorney, Agent, or Firm*—Darby & Darby

(57) ABSTRACT

A circuit for compensating for an offset voltage in a PhotoDetector Integrated Circuit (PDIC). The circuit includes a temperature detection unit, a current transfer unit and a current adjustment unit. The temperature detection unit generates a current that varies with variation in surrounding temperature. The current transfer unit transfers the generated current. The current adjustment unit adjusts the current transferred from the current transfer unit at a predetermined ratio and outputs the adjusted current.

8 Claims, 5 Drawing Sheets

CIRCUIT AND METHOD FOR COMPENSATING FOR OFFSET VOLTAGE

INCORPORATION BY REFERENCE

The present application claims priority under 35 U.S.C. §119 to Korean Patent Application No. 2005-15020 filed on Feb. 23, 2005. The content of the application is incorporated herein by reference in its entirety.

BACKGROUND OF THE INVENTION

1. Field of the Invention

The present invention relates generally to a circuit and method for compensating for variation in an offset voltage depending on variation in temperature in a photodiode integrated circuit and, more particularly, to a circuit and method capable of compensating for variation in an offset voltage depending on variation in surrounding temperature by adding a circuit for varying currents flowing through bipolar junction transistors, the characteristics of which varies with variation in surrounding temperature, according to variation in temperature.

2. Description of the Related Art

Recently, optical storage technology is developing toward high density, high speed and compactness in technical competition with memory, hard disk and magnetic disk technology, and the importance of the optical storage technology is increasing due to advantages over other storage technologies.

Such optical storage technology uses a method in which a disk drive and a storage medium (that is, an optical disk) are detachably attached to each other. The storage medium has advantages in that it can be implemented at low cost compared to other storage media, and data can be permanently stored thereon. In particular, the durability of the optical storage medium against temperature and impact is known to be excellent compared to that of other storage media.

However, the optical storage technology is disadvantageous in that its transmission rate is low and its storage capacity is low. To overcome the disadvantages, high-capacity and high-speed optical storage technologies rivaling a magnetic disk have recently been developed with rapid technological advances. Currently, research into a PhotoDetector Integrated Circuit (PDIC), that is, one of optical storage technologies, is being conducted.

FIG. 1 is a schematic diagram of a typical PDIC.

As shown in FIG. 1, the PDIC generates a current $I_{ph}$ when light is incident on a light-receiving element, for example, a photodiode 10. The current $I_{ph}$ is converted into a voltage and is amplified by a current-voltage conversion amplifier 20 and a feedback resistor $R_F$, so that an output voltage $V_{OUT}$ is output.

When an input optical signal is 0, that is, when an optical signal input to the photodiode 10 does not exist, the output voltage $V_{OUT}$ must be 0 V ideally. However, a current flows from the inverting and non-inverting input terminals of the current-voltage conversion amplifier 20, and a voltage that is applied to the feedback resistor $R_F$ appears at an output terminal, so that the output voltage $V_{OUT}$ is not 0. In this case, the applied voltage is referred to as an offset voltage.

In the prior art, to compensate for such an offset voltage, a method of compensating for the offset voltage by reducing the magnitude of an offset current flowing from the inverting and non-inverting input terminals is used.

As an example, FIG. 2 shows the construction of a conventional current-voltage conversion amplifier 20 including a compensation circuit 21.

The current-voltage conversion amplifier 20 has a non-inverting input terminal (+) and an inverting input terminal (−). A reference character $R_F$ of FIG. 1 corresponds to a feedback resistor. Metal-Oxide-Silicon Field Effect Transistors (MOSFETs) $P_7$ and $P_8$ constitute an active resistor 24. A capacitor $C_1$ is a circuit element for compensating for frequency characteristics.

When no optical signal is incident on the photodiode that is connected to the non-inverting input terminal (+), an offset current $I_{B1}$ flowing from the base terminal of a transistor $Q_1$, which is a Bipolar Junction Transistor (BJT), generates the offset voltage.

For convenience of description, it is assumed that the magnitude of the offset current flowing from the non-inverting terminal (+) is 1 μA. Constant current values of 100 μA, 50 μA and 50 μA are set on MOSFETs $P_1$, $P_2$ and $P_3$, respectively, by a bias stage.

Accordingly, when constant currents $I_{C1}$ and $I_{C2}$ flowing through transistors $Q_1$ and $Q_2$, which are identical BJTs, each are 50 μA, and the amplification factor of the transistor $Q_1$ is 50, the offset current $I_{B1}$ is 1 μA. That is, when the compensation circuit does not exist, the offset current $I_{B1}$ is 1 μA.

Meanwhile, the current $I_1$ of 50 μA flowing through the MOSFET $P_3$ also flows through a transistor $Q_3$. Assuming that the amplification factor of the transistor $Q_3$ is 50, the base current $I_{B4}$ of the transistor $Q_3$ is 1 μA. A current division unit 23 is composed of current mirror circuits, and the MOSFETs $P_4$ and $P_5$ and MOSFETs $P_4$ and $P_6$ constitute two pairs of current mirrors. In the current division unit 23, a current $I_{B3}$ flowing through the MOSFET $P_4$ is divided into halves of the current $I_{B3}$, that is, 0.5 μA, and is then mirrored. The mirrored currents 0.5 μA are applied to the non-inverting input terminal (+) and the inverting input terminal (−), and the current compensates for the offset current $I_{B1}$, so that the current of the base terminal of the transistor $Q_1$ is 0.5 μA.

Since the compensation current is 0.5 μA and the current flowing from the non-inverting input terminal (+) is 1 μA, the offset current is 0.5 μA.

The offset voltage $V_{OUT}$ is affected by the magnitude of the offset current $I_{B1}$, and the magnitude of the offset current $B_{I1}$ is reduced by the compensation circuit 21. As a result, variation in the output voltage $V_{OUT}$, which is affected by the magnitude of the offset current, decreases even though variation occurs due to arbitrary factors.

Meanwhile, of the elements constructing the current-voltage conversion circuit 22, BJTs $O_1$, $Q_2$ and $Q_4$ have base-emitter voltages that are affected by variation in surrounding temperature, so that the base-emitter voltage $V_{BE}$ decreases by about 2 mV whenever the surrounding temperature increases by 1° C., and the base-emitter voltage $V_{BE}$ increases by 2 mV whenever the surrounding temperature decreases by 1° C.

The case of the transistor $Q_4$ is described below. When the surrounding temperature increases, the current $I_{C4}$ flowing through the transistor $Q_4$ is constant at 50 μA because the base-emitter voltage $V_{BE}$ of the transistor $Q_4$ decreases and the current $I_{C4}$ is fixed at 50 μA by a bias applied to the MOSFET $P_2$ regardless of the variation of the base-emitter voltage $V_{BE}$, so that the output voltage $V_{OUT}$ increases.

In contrast, when the temperature decreases, the base-emitter voltage $V_{BE}$ of the transistor $Q_4$ increases, and the current $I_{C4}$ flowing through the transistor $Q_4$ is constant at 50 µA, so that the output voltage $V_{OUT}$ decreases.

As described above, when the output voltage varies, the operation of the circuit, which is designed to be optimized for a constant offset voltage, is affected by variation in surrounding temperature.

As shown in FIG. 2, the circuit having the conventional compensation circuit 21 does not directly compensate for variation in the offset voltage depending on variation in surrounding temperature, and only reduces the magnitude of the offset current in proportion to the offset voltage, thus causing only an effect of reducing the variation in the offset voltage depending on variation in temperature.

In the circuit including the BJTs, a compensation circuit, which allows a constant operation regardless of the variation in temperature by compensating for the variation in the magnitude of the output voltage generated depending on variation in surrounding temperature, is required.

In relation to such a compensation circuit, Japanese Unexamined Pat. Pub. No. 11-68476 discloses a scheme of correcting an offset voltage by applying an offset setting voltage to the substrate of a MOSFET that constitutes a differential amplifier as an example of a scheme for compensating an offset voltage.

Although the disclosed scheme may be a next best measure for compensating for operational variation depending on variation in temperature, it does not provide a direct solution to the problem caused by variation in the operational value of elements depending on variation in temperature.

SUMMARY OF THE INVENTION

Accordingly, the present invention has been made keeping in mind the above problems occurring in the prior art, and an object of the present invention is to provide a compensation circuit, which is capable of compensating for the characteristics of BJTs depending on variation in surrounding temperature in a circuit including the BJTs.

Another object of the present invention is to provide a circuit, which is capable of compensating for variation in characteristics of BJTs depending on temperature.

A further object of the present invention is to provide a method of compensating for the operational characteristics of the circuit depending on variation in temperature.

In order to accomplish the above object, an embodiment of the present invention provides a circuit for compensating for an offset voltage, including a temperature detection unit for generating a current that varies with variation in surrounding temperature; a current transfer unit for transferring the generated current; and a current adjustment unit for adjusting the current transferred from the current transfer unit at a predetermined ratio and outputting the adjusted current.

In addition, another embodiment of the present invention provides a circuit for compensating for an offset voltage, including a temperature detection unit for generating a current that varies with variation in surrounding temperature; a current transfer unit for transferring the generated current; a current adjustment unit for amplifying and transferring the current transferred from the current transfer unit; and an output unit configured to have a device for generating a constant current regardless of variation in surrounding temperature, and to output a compensated offset voltage by adding the current received from the current adjustment unit to the current generated at the device.

In addition, the present invention provides a method for compensating for an offset voltage, including the steps of generating a current that varies with variation in surrounding temperature; mirroring and transferring the generated current; and generating a compensation current by amplifying the transferred current at a predetermined ratio and transferring the compensation current.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE INVENTION

Embodiments of the present invention are described in detail with reference to the accompanying drawings below.

Figure 3:
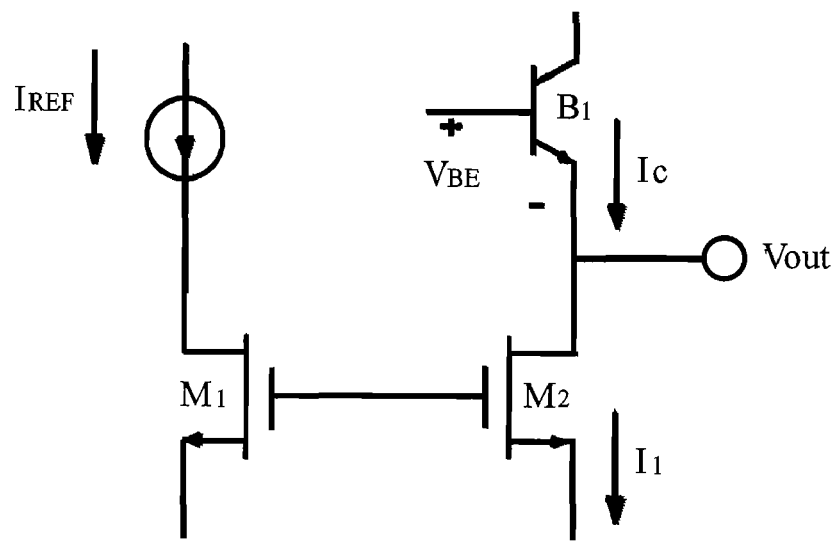
FIG. 3 is a circuit diagram showing the construction of the output stage of a typical current-voltage conversion amplifier.
Figure 2:
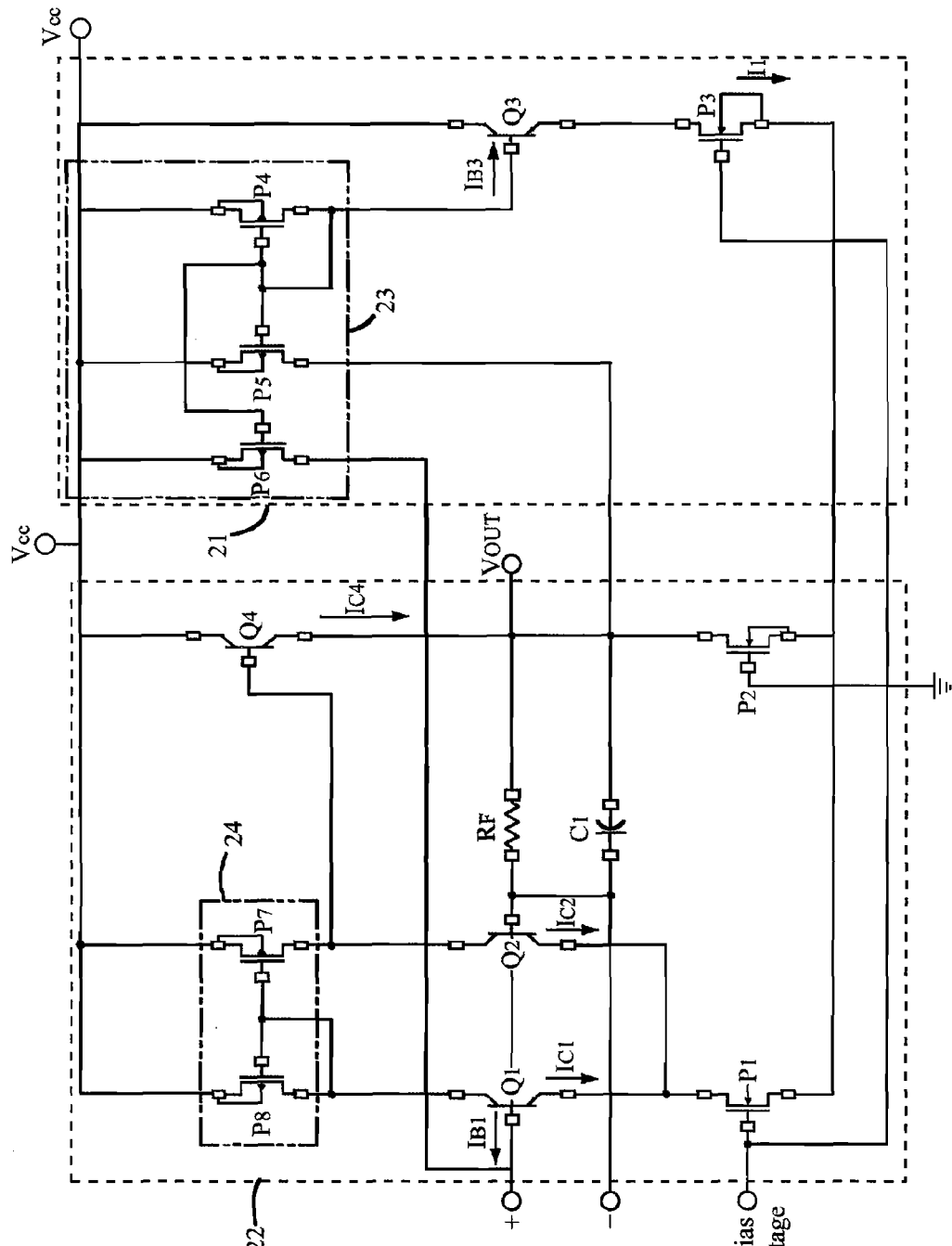
FIG. 2 is a circuit diagram showing the internal construction of a conventional current-voltage conversion amplifier.

FIG. 3 is a circuit diagram illustrating the variation in output voltage depending on variation in surrounding temperature, which shows the construction of the output stage of a typical current-voltage conversion amplifier. When temperature increases, the base-emitter voltage $V_{BE}$ of a transistor $B_1$, which is a BJT, decreases by 2 mV per 1° C. In this case, an output voltage $V_{OUT}$ decreases because a current $I_c$ is fixed at the same magnitude as a current $I_1$.

In this case, the current $I_c$, which flows through the transistor $B_1$, and the base-emitter voltage $V_{BE}$ have a relationship as in the following Equation 1:

$$I_c = I_s e^{\frac{V_{BE}}{V_T}} \qquad (1)$$

where $I_s$ is the intrinsic saturation current value of the BJT $B_1$, and $V_T$ is a intrinsic threshold voltage value of the BJT $B_1$, which has a constant value.

Accordingly, based on the above-described relationship, with respect to the base-emitter voltage $V_{BE}$ that varies with temperature, the current $I_c$ flowing through the transistor $B_1$ is constant in the conventional circuit, but the variation in the offset voltage depending on temperature can be compensated for if the magnitude of the current $I_c$ varies dynamically.

Figure 4:
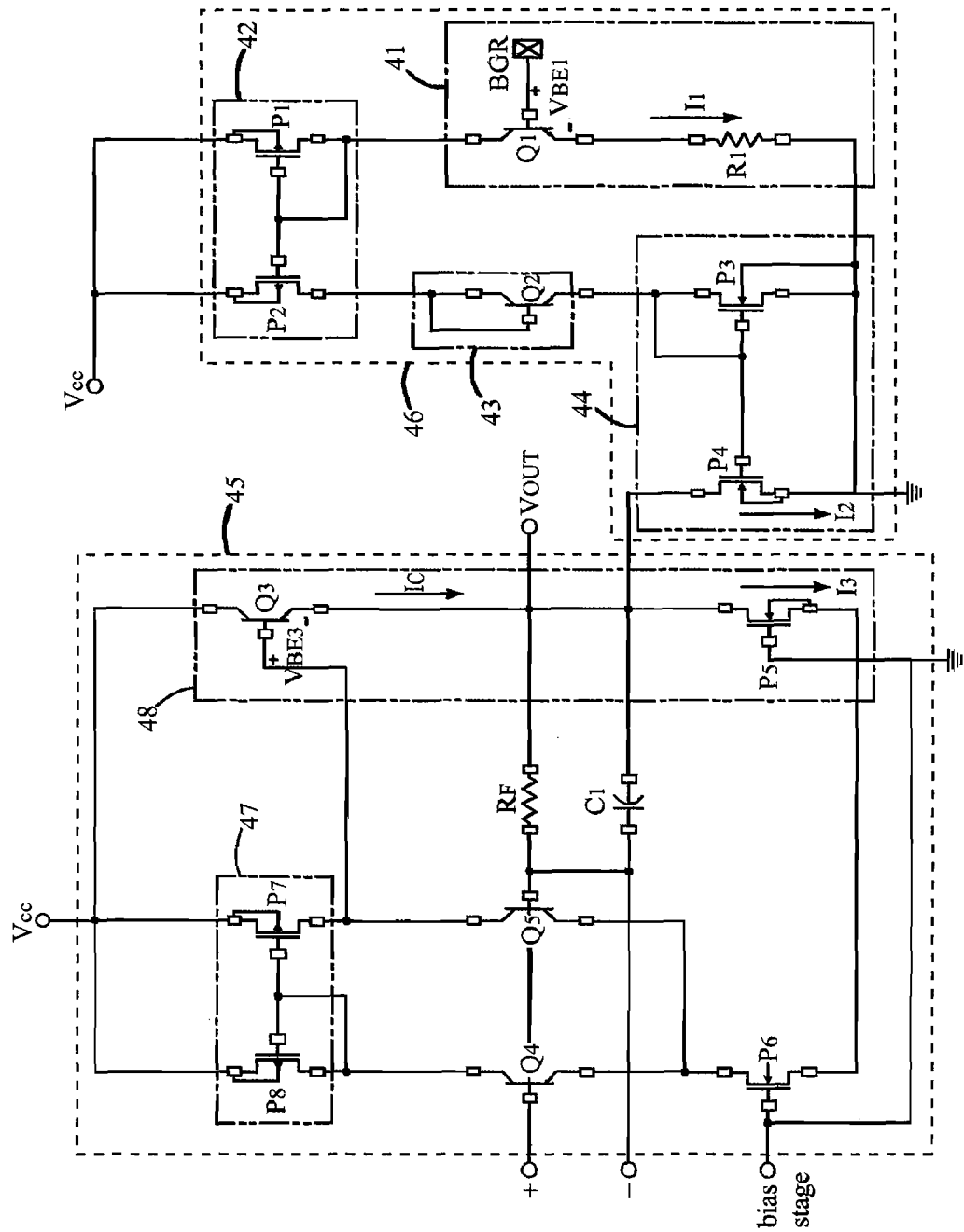
FIG. 4 is a circuit diagram showing a circuit for compensating for an offset voltage according to the present invention.

FIG. 4 shows the construction of a PDIC having a circuit for compensating for variation in an offset voltage depending on variation in temperature, according to an embodiment of the present invention.

A compensation circuit unit 46 is connected to the output terminal $V_{OUT}$ of a current-voltage conversion amplifier 45. The current-voltage conversion amplifier 45 includes an output unit 48 for transferring an input current to the output terminal $V_{OUT}$ in a voltage form. The output unit 48 includes a BJT $Q_3$ that is affected by variation in surrounding temperature, and a MOSFET $P_5$ that generates a constant current $I_3$ using a bias stage (not shown) regardless of variation in surrounding temperature.

Figure 1:
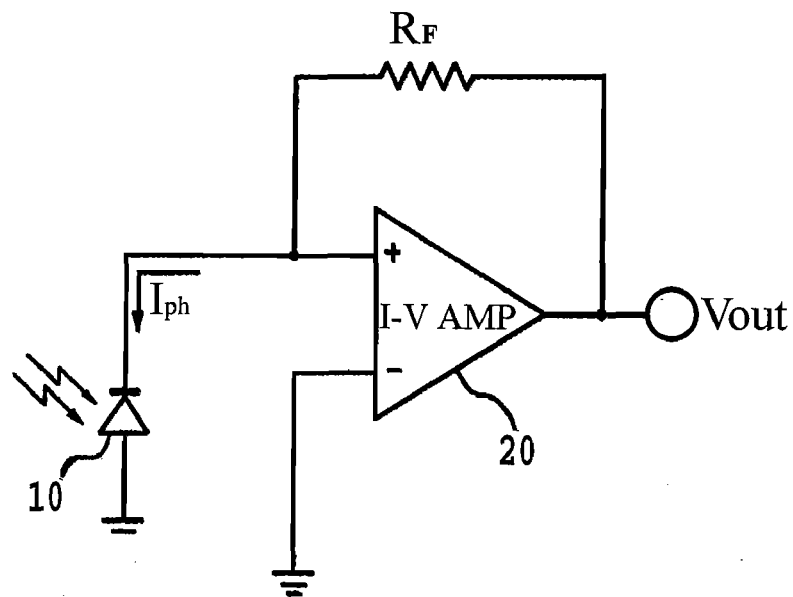
FIG. 1 is a schematic diagram of a typical PDIC.

The current-voltage conversion amplifier 45 has a non-inverting terminal (+) and an inverting terminal (−). A feedback resistor $R_F$ corresponds to the feedback resistor $R_F$ of FIG. 1. A capacitor $C_1$ is a circuit element for compensating for frequency characteristics.

Constant current values of 100 μA and 50 μA are set on MOSFETs $P_6$ and $P_5$ by the bias stage (not shown).

The compensation circuit unit 46 includes a temperature detection unit 41, a current transfer unit 42, a current adjustment unit 44, and a current-voltage conversion unit 45. Preferably, the compensation circuit unit 46 may further include a voltage adjustment element 43.

When current that varies with variation in temperature is generated by the temperature detection unit 41, the current transfer unit 42 transfers the generated current to the current adjustment unit 44, and the current adjustment unit 44 amplifies the transferred current at a predetermined ratio and transfers the amplified current to the current-voltage conversion unit 45.

The output unit 48 of the current-voltage conversion unit 45 adds the current transferred from the current adjustment unit 44 to the current generated within the current-voltage conversion unit 45, converts the added current into a compensation voltage, and outputs the compensation voltage. The voltage adjustment element 43 is a circuit equivalent to a diode, which adjusts a voltage difference between both the terminals of the current transfer unit 42 by compensating for a voltage drop generated at a transistor $Q_1$.

The operation of the current-voltage conversion unit is described in more detail below.

When the surrounding temperature increases, the base-emitter voltage $V_{BE3}$ of the transistor $Q_3$, which is a BJT of the current-voltage compensation circuit, decreases 2 mV per 1° C. Similarly, the base-emitter voltage $V_{BE1}$ of the transistor $Q^1$ having the same characteristics as the transistor $Q_3$ also decreases. A BandGap Reference (BGR) circuit for supplying a constant voltage regardless of variation in temperature is connected to the base terminal of the transistor $Q_1$.

In contrast, when the surrounding temperature decreases, both the base-emitter voltages $V_{BE3}$ and $V_{BE1}$ of the transistors $Q_3$ and $Q_1$ increase 2 mV per 1° C.

A current $I_1$ flowing through the transistor $Q_1$ is a current, the magnitude of which varies with the variation in the base-emitter voltages $V_{BE3}$ of the transistor $Q_1$. The current $I_1$ is mirrored by the current transfer unit 42 and then transferred to the voltage adjustment element 43.

Preferably, the current transfer unit 42 may include two identically sized MOSFETs. The voltage adjustment element 43 compensates for a voltage drop generated at the transistor $Q_1$ by adjusting a voltage difference between both the terminals of the current transfer unit 42. Preferably, the voltage adjustment element 43, as shown in FIG. 3, may be implemented using a BJT in which a base terminal is connected to a collector terminal. The BJT is a circuit equivalent to a diode, and may be replaced by a diode or some other element according to embodiments.

The current adjustment unit 44 amplifies current from the current transfer unit 42 at a predetermined ratio, and transfers a compensation current $I_2$ to the current-voltage conversion unit 45. The current adjustment unit 44 may include a mirror circuit having two MOSFETs $P_3$ and $P_4$ that are not identical to each other in size. An amplification factor is determined by the sizes of the MOSFETs. The size of a MOSFET is defined as a ratio of width (w) to length (l). Since the value of length (l) is fixed at the time of designing the MOSFET not to be adjusted, it is preferred to adjust the amplification factor by adjusting the value of width (w). For example, when the size ratio of the MOSFETs $P_3$ and $P_4$ is 1:2, a transferred current is amplified times two. The amplification ratio may differ depending on the temperature variation characteristics of the transistor $Q_3$ of the current-voltage conversion circuit 45.

A current amplified by the current adjustment unit 43 is a compensation current $I_2$, and flows through the MOSFET $P_4$. In this case, the following equation is established.

$$I_c = I_2 + I_3.$$

where $I_3$ is a current that flows through the MOSFET $P_5$ and the magnitude of which is fixed, and $I_2$ is a current that varies depending on temperature with the assistance of the compensation circuit unit 46.

As a result, the current $I_C$ that is a sum of the current $I_2$ and the current $I_3$ dynamically varies with variation in surrounding temperature.

Accordingly, when the base-emitter voltage $V_{BE}$ of the transistor $Q_3$ varies with variation in temperature, the current $I_c$ flowing through the transistor $Q_3$ varies, so that the output voltage $V_{OUT}$ become constant regardless of variation in temperature.

The circuit for compensating for an offset voltage depending on variation in temperature according to the present invention can be applied to all the circuits including BJTs.

Figure 5:
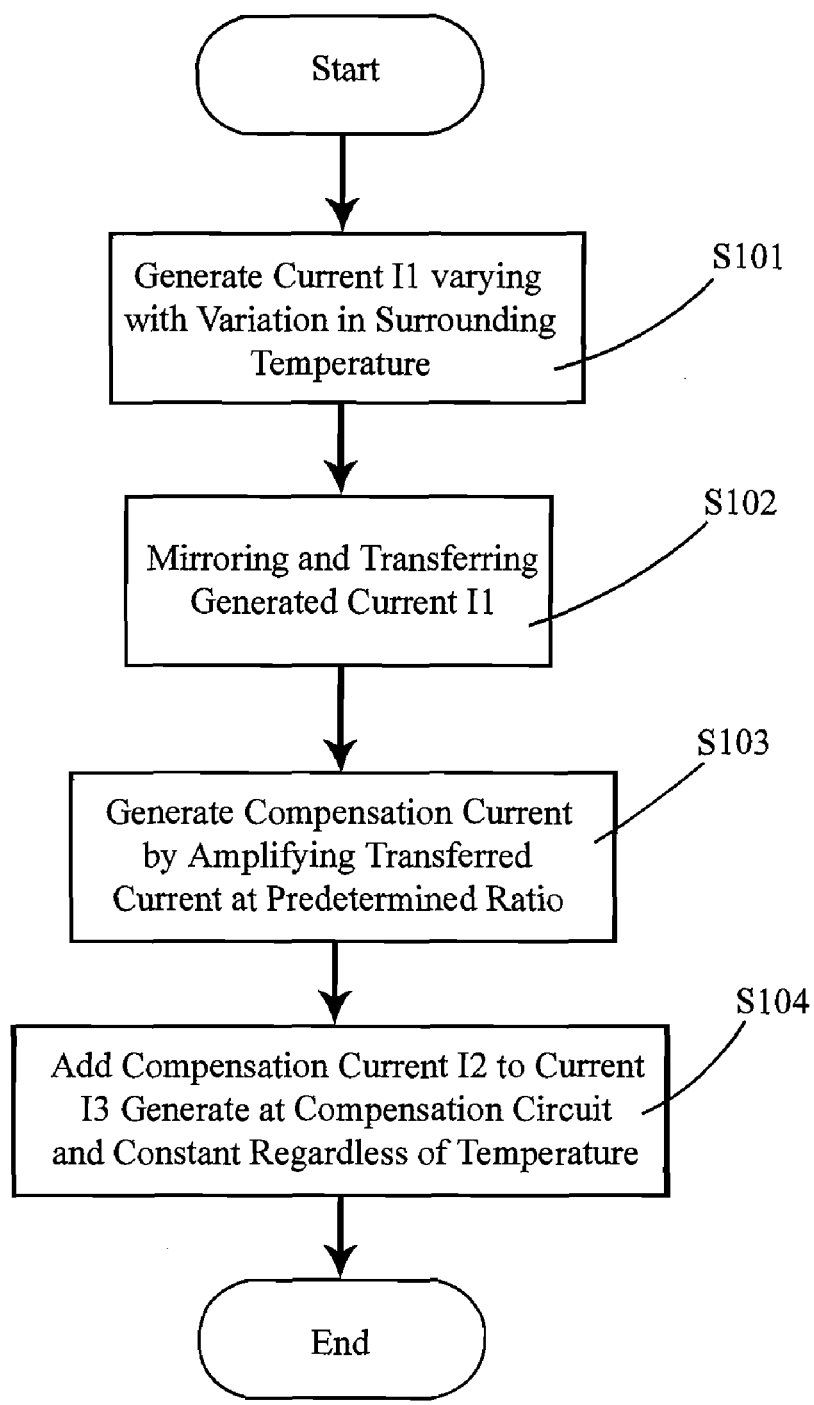
FIG. 5 is a flowchart illustrating a method for compensating for an offset voltage according to the present invention.

FIG. 5 is a flowchart illustrating a method of compensating for an offset voltage according to the present invention.

A current $I_1$ that varies with variation in surrounding temperature is generated at step S101.

If the temperature increases, the magnitude of the base-emitter voltage VBE of the transistor $Q_1$ decreases, so that the magnitude of the current $I_1$, which flows through a resistor $R_1$ connected to a lower terminal of the transistor $Q_1$, increases. If the temperature decreases, the magnitude of the base-emitter VBE increases, so that the magnitude of the current $I_1$, which flows through a resistor $R_1$ connected to a lower terminal of the transistor $Q_1$, decreases.

Thereafter, the generated current $I_1$ is mirrored and transferred at step S102.

The generated current $I_1$ is transferred through the mirror circuit, which includes two identically sized MOSFETs, at a predetermined ratio.

The method of the present invention may further include the step of adjusting the driving voltage of a selectively transferred current, in which case a voltage between circuits can be adjusted.

As described above, the transferred current is amplified at a predetermined ratio, so that the compensation current $I_2$ is generated at step S103. Preferably, the current can be amplified at a predetermined ratio using a mirror circuit including MOSFETs having different sizes.

Thereafter, at step S104, the added current $I_c$ is generated by adding the compensation current $I_2$ to a current that is constant regardless of variation in temperature in a circuit the offset voltage of which is compensated for.

The method of compensating for an offset voltage depending on variation in temperature according to the present invention may be applied to all the circuits including BJTs.

Figure 6:
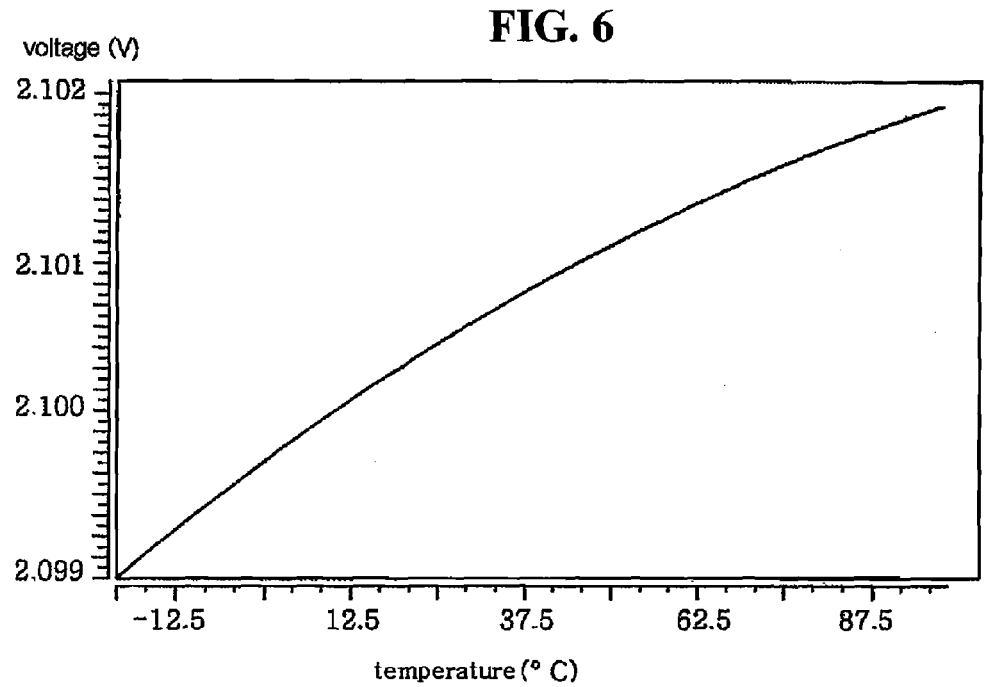
FIG. 6 is a graph showing the operational effect of a conventional circuit.

FIG. 6 shows output voltage characteristics depending on variation in temperature in the case in which a circuit for compensating for an offset voltage is not included. It can be seen that the output voltage $V_{OUT}$ is unstable, that is, the output voltage $V_{OUT}$ increases or decreases in proportion to variation in temperature.

Figure 7:
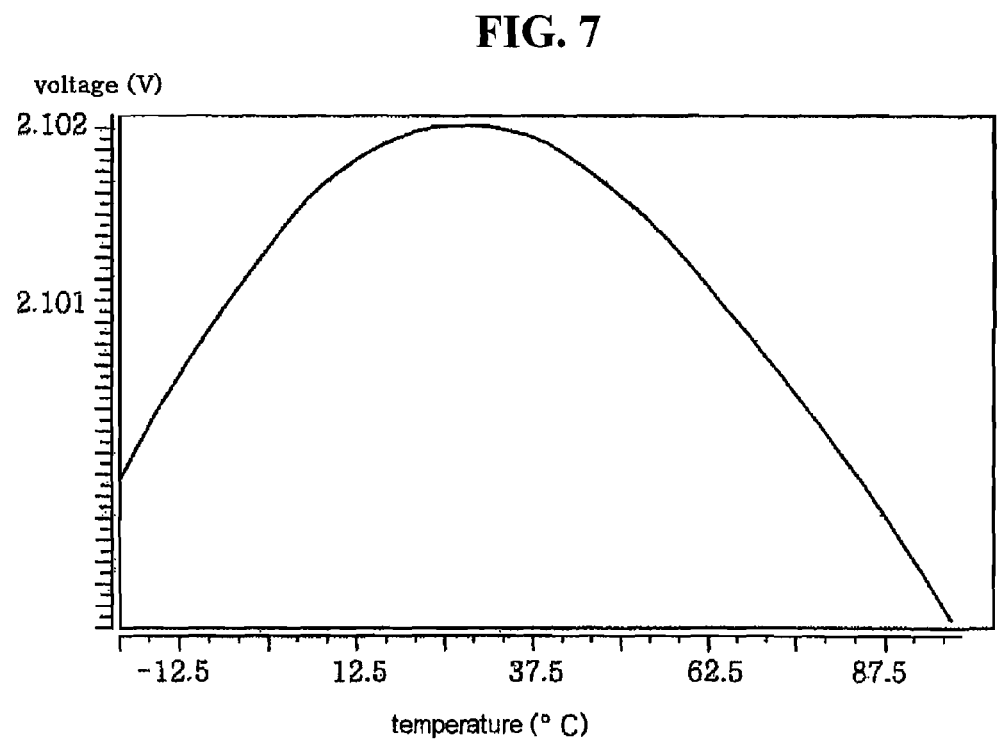
FIG. 7 is a graph showing the operational effect of the circuit for compensating for an offset voltage according to the present invention.

FIG. 7 shows output voltage characteristics depending on variation in temperature in the case in which the circuit for compensating for an offset voltage according to the present invention is included. It can be seen that, even though the temperature varies, the output voltage $V_{OUT}$ is limited to a specific range and is stable.

As described above, the present invention can compensate for the characteristics of BJTs that vary depending on variation in surrounding temperature in a circuit including the BJTs.

Furthermore, the present invention can provide a circuit in which variation in the characteristics of BJTs depending on variation in surrounding temperature are compensated for.

Although the preferred embodiment of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A circuit for compensating for an offset voltage, comprising:
   a temperature detection unit generating a first current varying with a variation in surrounding temperature;
   a current transfer unit configured to transfer the first current generated by the temperature detection unit;
   a current adjustment unit configured to amplify and transfer the transferred first current transferred by the current transfer unit; and
   an output unit having a first semiconductor device operable to establish the offset voltage of the circuit, the offset voltage varying with a variation in the surrounding temperature and in a second current flowing through the first semiconductor device, and a second semiconductor device operable to generate a third current that is substantially constant regardless of the variation in surrounding temperature, the output unit being capable of adjusting the offset voltage to compensate for temperature variation by adding the current amplified and transferred by the current adjustment unit to the third current generated by the second semiconductor device to adjust the second current flowing through the first semiconductor device.

2. The circuit as set forth in claim 1, wherein the temperature detection unit comprises a transistor having a voltage between a base terminal and an emitter terminal varying with the variation in surrounding temperature.

3. The circuit as set forth in claim 2, wherein the temperature detection unit comprises:
   a voltage source providing a constant voltage regardless of the variation in surrounding temperature; and
   a resistor connected to the emitter terminal of the transistor.

4. The circuit as set forth in claim 1, wherein the current transfer unit comprises a mirror circuit having two transistors identical in size.

5. The circuit as set forth in claim 1, wherein the current adjustment unit comprises a mirror circuit having two transistors.

6. The circuit as set forth in claim 1, further comprising a voltage adjustment device connected between the current transfer unit and the current adjustment unit for adjusting a voltage difference between an input and an output terminal of the current transfer unit to compensate for a voltage drop at the temperature detection unit.

7. A method for compensating for an offset voltage, comprising the steps of:
   generating a current varying with variation in surrounding temperature;
   mirroring and transferring the generated current;
   generating a compensation current comprising the steps of:
      amplifying the transferred current at a predetermined ratio; and
   transferring the amplified, current to provide the compensation current;
   adding the compensation current to a second current that is substantially constant regardless of variation in surrounding temperature to produce an added current
   converting the added current to the offset voltage, wherein offset voltage varies as a function of variations in surrounding temperature and the added current, and wherein the variation in the offset voltage due to variations in the surrounding temperature is compensated by a variation in the added current; and
   outputting the converted voltage.

8. The method as set forth in claim 7, wherein the step of mirroring and transferring the generated current further comprises the step of adjusting a driving voltage for the transferred current.

* * * * *